(12) United States Patent
Chen et al.

(10) Patent No.: US 11,004,907 B2
(45) Date of Patent: May 11, 2021

(54) ORGANIC LIGHT-EMITTING DISPLAY PANEL AND PIXEL ARRANGEMENT THEREOF

(71) Applicant: Shanghai Tianma AM-OLED Co., Ltd., Shanghai (CN)

(72) Inventors: Xian Chen, Shanghai (CN); Lijing Han, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/452,746

(22) Filed: Jun. 26, 2019

(65) Prior Publication Data

US 2020/0279892 A1 Sep. 3, 2020

(30) Foreign Application Priority Data

Feb. 28, 2019 (CN) .......................... 201910149933.X

(51) Int. Cl.
*H01L 27/32* (2006.01)
*G09G 3/3225* (2016.01)

(52) U.S. Cl.
CPC ....... *H01L 27/3218* (2013.01); *G09G 3/3225* (2013.01); *G09G 2300/0452* (2013.01)

(58) Field of Classification Search
CPC .............. H01L 27/3218; G09G 3/3225; G09G 2300/0452

See application file for complete search history.

(56) References Cited

U.S. PATENT DOCUMENTS

2002/0140713 A1* 10/2002 Klompenhouwer ..... G09G 3/32
345/690
2005/0259114 A1* 11/2005 Belmon ............... G09G 3/3607
345/613

(Continued)

FOREIGN PATENT DOCUMENTS

| CN | 104201192 A | 12/2014 |
|---|---|---|
| CN | 106530989 A | 3/2017 |
| CN | 107275361 A | 10/2017 |

OTHER PUBLICATIONS

Chinese Office Action dated Apr. 30, 2020 for corresponding CN Application No. 201910149933.X, and English translation thereof.

*Primary Examiner* — Michael Pervan
(74) *Attorney, Agent, or Firm* — Tarolli, Sundheim, Covell & Tummino LLP

(57) ABSTRACT

The present disclosure provides a pixel arrangement, including repeating units each having a first to sixth pixel columns. The first pixel column includes a first sub-pixel of an $i^{th}$ pixel row and a second sub-pixel of a $(i+2)^{th}$ pixel row; the second pixel column includes third sub-pixels of a $j^{th}$ pixel row and a $(j+2)^{th}$ pixel row; the third pixel column includes a second sub-pixel of the $i^{th}$ pixel row and a first sub-pixel of the $(i+2)^{th}$ pixel row; the fourth pixel column includes a first sub-pixel of the $j^{th}$ pixel row and a second sub-pixel of the $(j+2)^{th}$ pixel row; the fifth pixel column includes third sub-pixels of the $i^{th}$ pixel row and the $(i+2)^{th}$ pixel row; and the sixth pixel column includes a second sub-pixel of the $j^{th}$ pixel row and a first sub-pixel of the $(j+2)^{th}$ pixel row, where i=1 and j=2; or j=1 and i=2.

19 Claims, 11 Drawing Sheets

(56) References Cited

U.S. PATENT DOCUMENTS

| | | | |
|---|---|---|---|
| 2006/0132408 A1* | 6/2006 | Shin | G09G 3/3648 345/89 |
| 2010/0060147 A1* | 3/2010 | Eom | H01L 51/5234 313/504 |
| 2013/0105833 A1* | 5/2013 | Weaver | H01L 27/3216 257/89 |
| 2015/0021637 A1* | 1/2015 | Ahn | H01L 27/3218 257/89 |
| 2015/0022078 A1* | 1/2015 | Huang | H01L 27/3218 313/504 |
| 2016/0240802 A1* | 8/2016 | Lee | H01L 27/3241 |
| 2016/0329385 A1* | 11/2016 | Qiu | H01L 27/3218 |

\* cited by examiner

ORGANIC LIGHT-EMITTING DISPLAY PANEL AND PIXEL ARRANGEMENT THEREOF

CROSS-REFERENCE TO RELATED DISCLOSURES

The present application claims priority to Chinese Patent Disclosure No. 201910149933.X, filed on Feb. 28, 2019, the content of which is incorporated herein by reference in its entirety.

TECHNICAL FIELD

The present disclosure relates to the field of display technologies, and in particular, to a pixel arrangement of an organic light-emitting display panel and an organic light-emitting display panel.

BACKGROUND

For an organic light-emitting diode (OLED) display panel, a light-emitting material should be deposited to apertures of a pixel definition layer (PDL) by means of a vapor deposition mask to form a light-emitting layer of sub-pixels of different colors (R/GB). The conventional pixel arrangement is limited by the openings of the mask and the distance between the openings, and the current pixel arrangement cannot correspond to the manufacturing of the mask and vapor deposition process of a product with high pixels per inch (PPI).

SUMMARY

In view of above, embodiments of the present disclosure provide a pixel arrangement of an organic light-emitting display panel and an organic light-emitting display panel, in order to solve the above problem.

In a first aspect, the present disclosure provides a pixel arrangement of an organic light-emitting display panel, including repeating units arranged in an array. Each of the repeating units includes a first pixel column, a second pixel column, a third pixel column, a fourth pixel column, a fifth pixel column, and a sixth pixel column that extend along a first direction and are arranged in a sequence along a second direction. In each of the repeating units, the first pixel column includes a first sub-pixel located in an $i^{th}$ pixel row and a second sub-pixel located in a $(i+2)^{th}$ pixel row; the second pixel column includes a third sub-pixel located in a $j^{th}$ pixel row and a third sub-pixel located in a $(j+2)^{th}$ pixel row; the third pixel column includes a second sub-pixel located in the $i^{th}$ pixel row and a first sub-pixel located in the $(i+2)^{th}$ pixel row; the fourth pixel column includes a first sub-pixel located in the $j^{th}$ pixel row and a second sub-pixel located in the $(j+2)^{th}$ pixel row; the fifth pixel column includes a third sub-pixel located in the $i^{th}$ pixel row and a third sub-pixel located in the $(i+2)^{th}$ pixel row; and the sixth pixel column includes a second sub-pixel located in the $j^{th}$ pixel row and a first sub-pixel located in the $(j+2)^{th}$ pixel row, where i=1 and j=2; or j=1 and i=2.

In a second aspect, the present disclosure provides an organic light-emitting display panel which applies the pixel arrangement as described above.

BRIEF DESCRIPTION OF DRAWINGS

In order to more clearly illustrate technical solutions of the embodiments of the present disclosure, the accompanying drawings used in the embodiments are briefly described below. The drawings described below illustrate merely a part of the embodiments of the present disclosure. Based on these drawings, those skilled in the art can obtain other drawings without any creative efforts.

DESCRIPTION OF EMBODIMENTS

Figure 1:
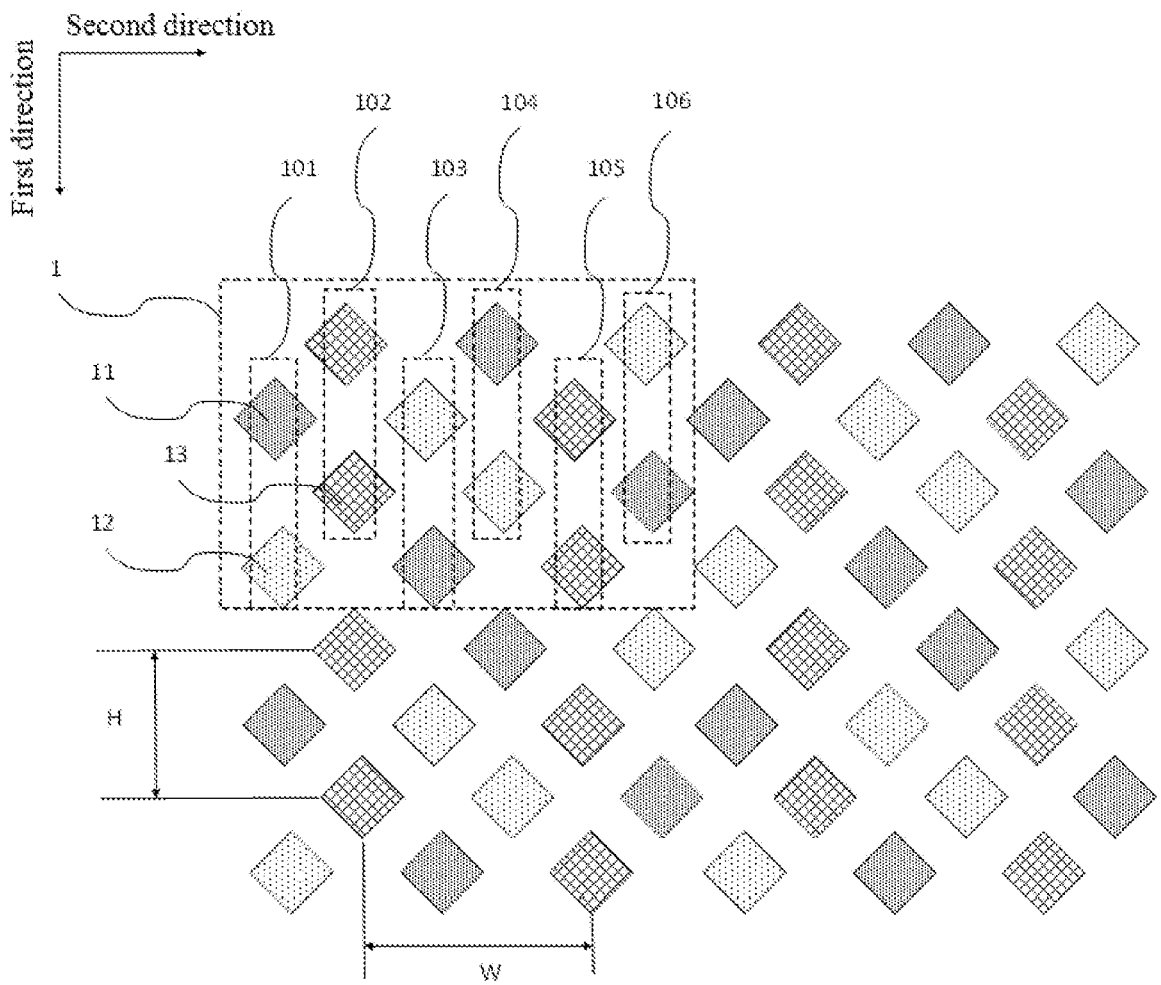
FIG. 1 is a schematic diagram of a pixel arrangement of an organic light-emitting display panel according to an embodiment of the present disclosure.
Figure 2:
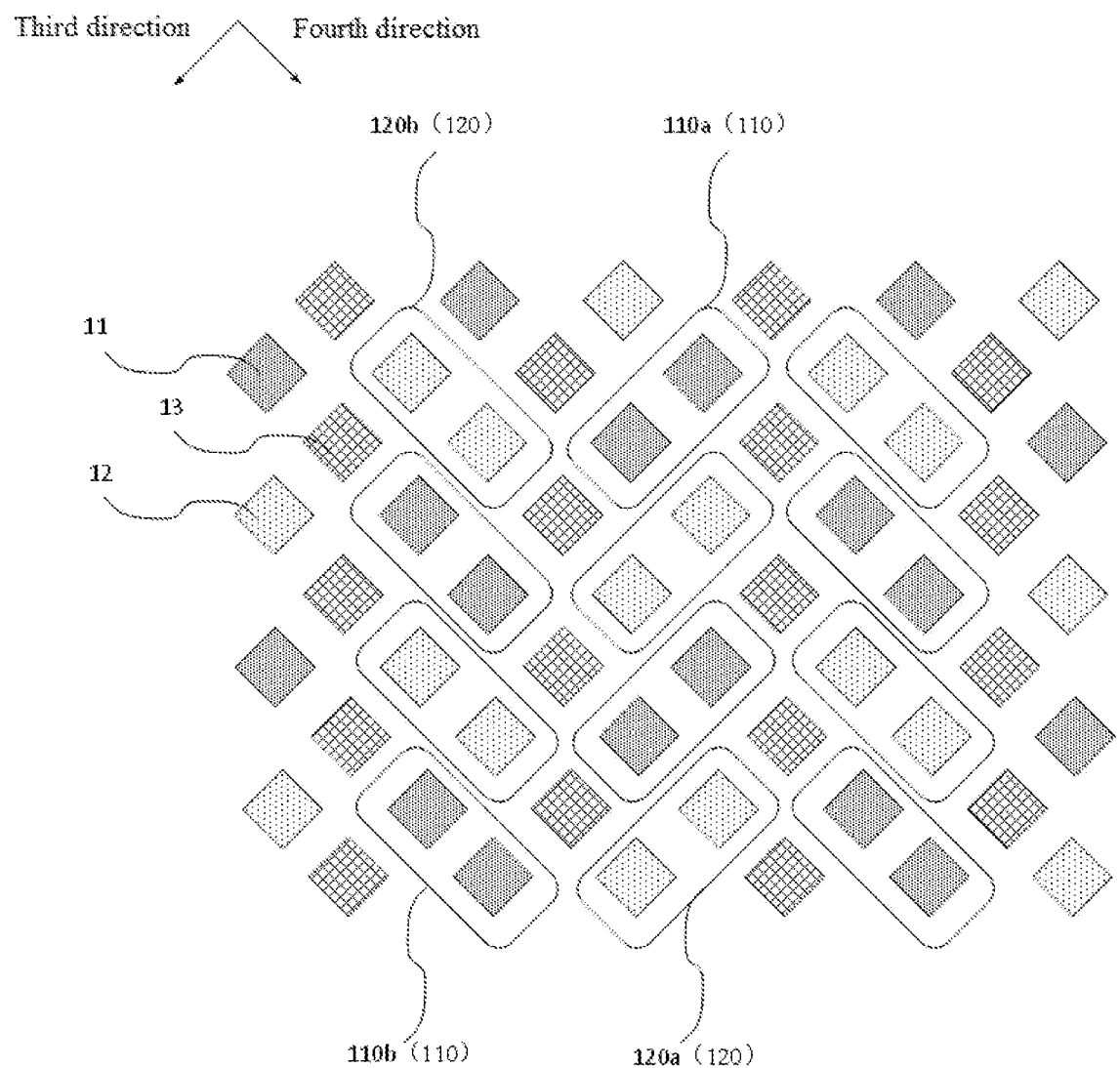
FIG. 2 is a schematic diagram of a pixel arrangement of an organic light-emitting display panel according to another embodiment of the present disclosure.

For a better understanding of the technical solutions of the present disclosure, the embodiments of the present disclosure are described in detail below with reference to the accompanying drawings.

It should be noted that the described embodiments are merely some embodiments of the present disclosure, rather than all of the embodiments. Other embodiments obtained by those skilled in the related art based on the embodiments of the present disclosure without creative efforts fall within the protection scope of the present disclosure.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and the pending claims of the present disclosure also represent a plural form.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects in front and at the back of "/" is an "or" relationship.

It should be understood that although the terms "first", "second" and "third" may be used to describe rather than limit pixel columns in embodiments of the present disclosure. These terms are only used to distinguish pixel columns from each other. For example, without departing from the scope of embodiments of the disclosure, a first pixel column may also be referred to as a second pixel column, and similarly, a second pixel column may also be referred to as a first pixel column.

As described in the background, the OLED (organic light-emitting) display panel is different from a liquid crystal display panel. The OLED display panel is driven by current, and a pixel driving circuit to the OLED device is required to connect the OLED device, in order to provide the OLED device with a driving current and drive the OLED device to emit light. The OLED device includes an anode, a cathode, and a plurality of organic materials disposed between the anode and the cathode. For example, in a top-emission type OLED display panel, the anode is generally a three-layered structure of ITO (indium tin oxide)/Ag (silver)/ITO, which can be patterned through conventional exposure, development, and etching processes. The organic material, due to the poor stability, cannot be patterned through the conventional etching process, and thus a vapor deposition process with a mask is used instead. That is, the organic material is placed in a vacuum environment, and is evaporated or sublimated by heating. The mask is disposed between a cavity for evaporating the organic material and an array substrate to be deposited. The mask has openings corresponding to the regions to be vapor-deposited, and the rest of mask provided with no opening corresponds to the regions where vapor deposition is not required. The evaporated or sublimated organic material molecules are attached to the array substrate to be deposited through the openings, thereby directly forming a patterned organic material layer. The mask used to deposit the light-emitting material layer of sub-pixels is a fine metal mask (FMM), also called a fine mask, and each opening of the mask corresponds to one sub-pixel. Due to limitations in the size of the opening of the fine mask, the size of the distance between the openings, and net-tension difficulties, it is difficult to further improve the image PPI (pixel density) of the organic light-emitting display panel with the pixel arrangement known in the related art.

On the other hand, since the aging of transistor in the pixel driving circuit will occur with the service time, which results in a drift of the threshold voltage and a change of the driving current. Therefore, the pixel driving circuit generally is integrated with a compensation function, such that the pixel driving circuit includes up to seven transistors and one capacitor. In this case, the pixel driving circuit has a minimum size on the array substrate, and the number of pixel driving circuits per unit area has a limit value. Each pixel driving circuit drives one sub-pixel, and thus the number of sub-pixels per unit area also has a limit value. Therefore, in the related art, the rendered pixels are used to increase the resolution of the display panel. A non-rendered pixel includes three sub-pixels, and a rendered pixel includes only 2 sub-pixels, so that the number of pixels can be increased by 50% without changing the sub-pixels, thereby improving the resolution. However, in order to realize full-color display, each rendered pixel including only 2 sub-pixels has to borrow the color that it cannot display from adjacent sub-pixels. In this way, apparent jagged and colored edges appear when displaying the edge of the image. Therefore, the arrangement of rendered pixels and the arrangement of non-rendered pixels have their own advantages and disadvantages. The pixel arrangement known in the related art is usually designed for only one of rendering or non-rendering, and cannot be applied to two different pixel arrangements at the same time.

Figure 7:
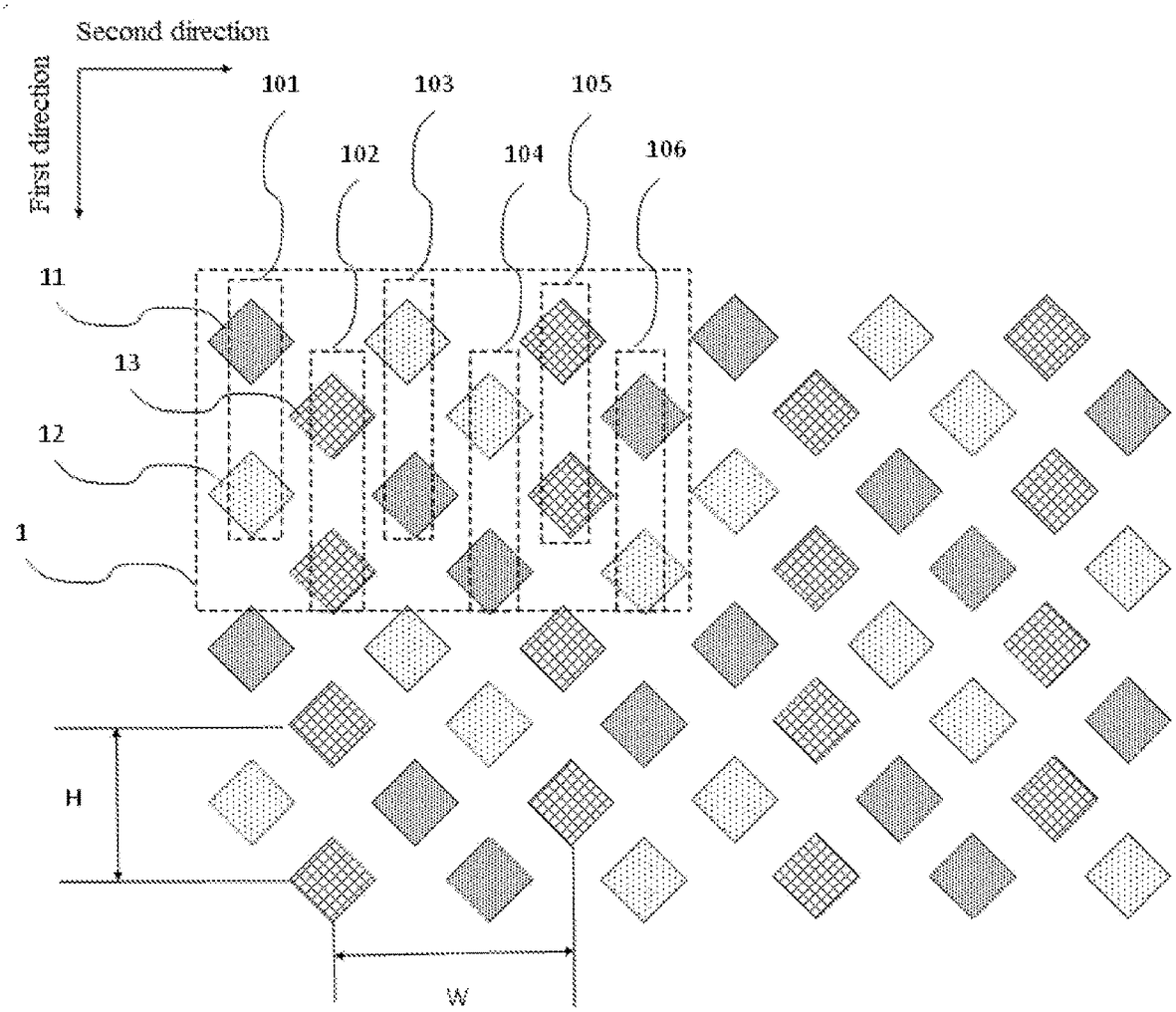
FIG. 7 is a schematic diagram of a pixel arrangement of an organic light-emitting display panel according to yet another embodiment of the present disclosure.

The inventor has invented a pixel arrangement to solve the above technical problems. FIG. 1 is a schematic diagram of a pixel arrangement of an organic light-emitting display panel according to an embodiment of the present disclosure, and FIG. 7 is a schematic diagram of a pixel arrangement of an organic light-emitting display panel according to another embodiment of the present disclosure.

The present disclosure provides a pixel arrangement of an organic light-emitting display panel including repeating units 1 arranged in an array. Each repeating unit 1 includes a first pixel column 101, a second pixel column 102, a third pixel column 103, a fourth pixel column 104, a fifth pixel column 105, and a sixth pixel column 106, extending along a first direction and arranged in sequence along a second direction. The first pixel column 101 includes a first sub-pixel 11 located in an $i^{th}$ pixel row and a second sub-pixel 12 located in a $(i+2)^{th}$ pixel row. Taking FIG. 1 as an example, i=2, and the first sub-pixel 11 in the first pixel column 101 is located in the second pixel row, and the second sub-pixel 12 in the first pixel column 101 is located in the fourth pixel row. Taking FIG. 7 as an example, the first sub-pixel 11 in the first pixel column 101 is located in the first row, and the second sub-pixel 12 in the first pixel column 101 is located in the third row. It should be noted that the $i^{th}$ row discussed herein is the $i^{th}$ row of the entire repeating unit, rather than the $i^{th}$ row of the first pixel column. As shown in FIG. 1, the first sub-pixel 11 in the first pixel column 101 is located in the first row in the first pixel column 101, but in the second row of the entire repeating unit 1. The $i^{th}$ row or the $(i+2)^{th}$ row discussed herein refers to a row only located in the entire repeating unit.

Similarly, the second pixel column 102 includes a third sub-pixel 13 located in the $j^{th}$ pixel row and a third sub-pixel 13 located in the $(j+2)^{th}$ pixel row.

The third pixel column 103 includes a second sub-pixel 12 located in the $i^{th}$ pixel row and a first sub-pixel 11 located in the $(i+2)^{th}$ pixel row.

The fourth pixel column 104 includes a second sub-pixel 12 located in the $j^{th}$ pixel row and a first sub-pixel 11 located in the $(j+2)^{th}$ pixel row.

The fifth pixel column 105 includes a third sub-pixel 13 located in the $i^{th}$ pixel row and a third sub-pixel 13 located in the $(i+2)^{th}$ pixel row.

The sixth pixel column 106 includes a first sub-pixel 11 located in the $j^{th}$ pixel row and a second sub-pixel 12 located in the $(j+2)^{th}$ pixel row.

Among them, i=1, j=2; or j=1, i=2. Taking FIG. 1 as an example, i=2 and j=1. The first pixel column 101 includes a first sub-pixel 11 located in a $2^{nd}$ row and a second sub-pixel 12 located in a $4^{th}$ row; the second pixel column 102 includes a third sub-pixel 13 located in a $1^{st}$ row and a third sub-pixel 13 located in a $3^{rd}$ row; the third pixel column 103 includes a second sub-pixel 12 located in the $2^{nd}$ row and a first sub-pixel 11 located in the $4^{th}$ row; the fourth pixel column 104 includes a first sub-pixel 11 located in the $1^{st}$ row and a second sub-pixel 12 located in the $3^{rd}$ row; the fifth pixel column 105 includes a third sub-pixel 13 located in the $2^{nd}$ row and a third sub-pixel 13 located in the $4^{th}$ row; and the sixth pixel column 106 includes a second sub-pixel 12 located in the $1^{st}$ row and a first sub-pixel 11 located in the $3^{rd}$ row. Referring to the pixel arrangement of the organic light-emitting display panel shown in FIG. 1, pixels in an odd-numbered row and pixels in an even-numbered row are arranged in a staggered manner; along a column direction (the first direction), the first sub-pixel 11 and the second sub-pixel 12 are alternately arranged; and along a row direction (the second direction), the first sub-pixel, the second sub-pixel, and the third sub-pixel are alternately arranged. In the present disclosure, the first row of pixels and the last row of pixels each include sub-pixels of three different colors, so that the upper and lower edges have no colored edge. The left and right edges each include the alternately arranged first and second sub-pixels, and colored edges have a mixed color of the first sub-pixel and the second sub-pixel. The colored edge can be reduced by designing the pixel colors such that the mixed color of the first sub-pixel and the second sub-pixel is the least sensitive color to the human eye. On the other hand, in the present disclosure, since the sub-pixels of the odd-numbered rows and the sub-pixels of the even-numbered rows are arranged in the staggered manner, the aperture ratio of the sub-pixel is further improved, such that the current density of the driving current is smaller under the same brightness, and the aging of the material is delayed. In addition, a matching between the aperture ratio of the sub-pixel and the aging situation of colors can be achieved by means of aperture ratio differentiation design, so that the aging of sub-pixels of different colors tends to be consistent, thereby avoiding a long time color cast. For example, in common cases, blue sub-pixel has the shortest lifetime, and red and green sub-pixels have a similar lifetime. With the increasing service time of the display panel, the attenuation of the blue sub-pixels is severe, while the attenuation of the red and green sub-pixels is relatively light. Accordingly, after a long-term use, compared with the blue color, more red and green colors are displayed when displaying a white image, and thus the white color is yellowish. In the present disclosure, the blue sub-pixel has a larger area than the red sub-pixel, and the area of the blue sub-pixel is also larger than that of the green sub-pixel. In this case, the current density for the blue sub-pixel is smaller, and with the increasing of the service time, the attenuation of the brightness of the blue sub-pixel is comparable to that of the red sub-pixel and the green sub-pixel, so that the white color can still be displayed as a white color even after a long-term use, only with only a slight decrease in the brightness.

Further, in order to further reduce the lifetime attenuation of each sub-pixel and increase the overall brightness of the display panel, in the present disclosure, the first sub-pixel, the second sub-pixel, and the third sub-pixel all have a rhomboid shape. Since the sub-pixels of odd-numbered rows and the sub-pixels of even-numbered rows are arranged in a staggered manner in the present disclosure, the conventional rectangular or square pixels cannot utilize space between odd-numbered rows of sub-pixels or even-numbered rows of sub-pixels. In contrast, this problem can be overcome in the present disclosure by the pixel arrangement in conjunction with the rhombus shaped pixels. For example, a corner of a rhombus portion of a sub-pixel in an even-numbered row can be interposed into the space between two sub-pixels in an adjacent odd-numbered row, so that the space utilization of the display panel is improved, the area of each sub-pixel is increased, the current density is reduced, the lifetime attenuation is reduced, and the overall brightness of the display panel is improved, without changing the area of the display panel and the number of sub-pixels of each color. At present, consumers have an increasingly high demand for display quality of the display panel. High Dynamic Range (HDR) is a big selling point of cutting edge display panels. A HDR display allows the display panel to display the white and black colors with a better layering. With the increasing popularity of high dynamic contrast technology, the Video Electronics Standards Association (VESA) has launched an official certification program. The new standard includes ratings specification for brightness, color gamut, color depth, rise time, etc., typically HDR 600 and HDR 1000. The display effect of the HDR 1000 is superior to that of the HDR 600. The top Display HDR 1000 is required to have a peak brightness of 1000 cd/m$^2$, a long continuous brightness of 600 cd/m$^2$, and an angular brightness of 0.05 cd/m$^2$. The HDR 1000 requires that a display panel have a peak brightness of up to 1000 nits, so as to provide a better layering when displaying white color such as flames and the sky. Therefore, a high brightness is an essential feature of HDR displays. The rhomboid shaped pixels of this embodiment can significantly increase its area without depending upon the advance materials and devices, thereby increasing the brightness. On the other hand, referring to FIG. 6, the third sub-pixel 13 is designed to have a rhomboid shape, the edges of its corresponding opening 131 of the mask are inclined, and thus the stress direction is inclined to the edge of the display panel. Therefore, as long as the distance between two adjacent third sub-pixels 13 in the inclined direction meets stress requirements, the distance between two adjacent openings in the inclined direction can be relatively large, while the distance between the third sub-pixel openings 131 in the row direction or the column direction can be reduced to increase PPI.

In addition, the rhomboid shaped pixel corresponds to the rhomboid shaped mask opening, which balances horizontal and vertical vapor deposition shadows, and is more advantageous for the space design of the mask.

In the embodiment shown in FIG. 7, i=1, j=2, and the first row of pixels and the last row of pixels each include sub-pixels of three different colors, so that the upper and lower edges have no colored edge. The left and right edges each include alternately arranged first and second sub-pixels, and thus a mixed color of the first sub-pixel and the second sub-pixel forms a colored edge. The colored edge can be reduced by designing the pixel color such that the mixed color of the first sub-pixel and the second sub-pixel is the least sensitive color to the human eye. The pixel arrangement of the embodiment shown in FIG. 7 also has the same technical effects as the embodiment shown in FIG. 1, which is not repeated herein.

It should be noted that, for example, the top-emission type organic light-emitting display panel generally includes a substrate, a transistor layer disposed on the substrate, a planarization layer disposed on the transistor layer, an anode disposed on the planarization layer, and a pixel definition layer (PDL) disposed on the anode. The pixel definition layer is provided with apertures to expose the anode, an organic material covers the anode exposed by the apertures of the pixel definition layer, and the display panel further includes a cathode that covers the organic material. The final light-emitting area is a light-emitting area corresponding to the aperture area of the pixel definition layer, and the sub-pixel described in the present disclosure is the aperture area of the corresponding pixel definition layer.

Further, it can be seen that the arrangement of the third sub-pixels in the present disclosure is relatively regular. Specifically, the third sub-pixels are evenly arranged in both the column direction and the row direction. In this embodiment, the third sub-pixels 13 may be green sub-pixels, the first sub-pixels 11 are red sub-pixels and the second sub-pixels 12 are blue sub-pixels. Thus, the colored edge composed of the first sub-pixel and the second sub-pixel is purple, to which the human eye is not sensitive, so that the colored edge effect is reduced. Since the human eye is most sensitive to green, the green sub-pixels are disposed at the center of the pixel unit. In the present disclosure, the third sub-pixels are green sub-pixels, which are arrangement in a regular manner at the center of the pixel unit, i.e., evenly distributed in both the row direction and the column direction, thereby obtaining an optimal visual effect. Further, in order to obtain an optimal visual effect, a distance H between any two adjacent third sub-pixels 13 in the first direction is set to be equal, and a distance W between any two adjacent third sub-pixels 13 in the second direction is also set to be equal. In this way, the light-emitting center of the pixel unit has a regular arrangement so as to obtain an optimal visual effect.

Figure 4:
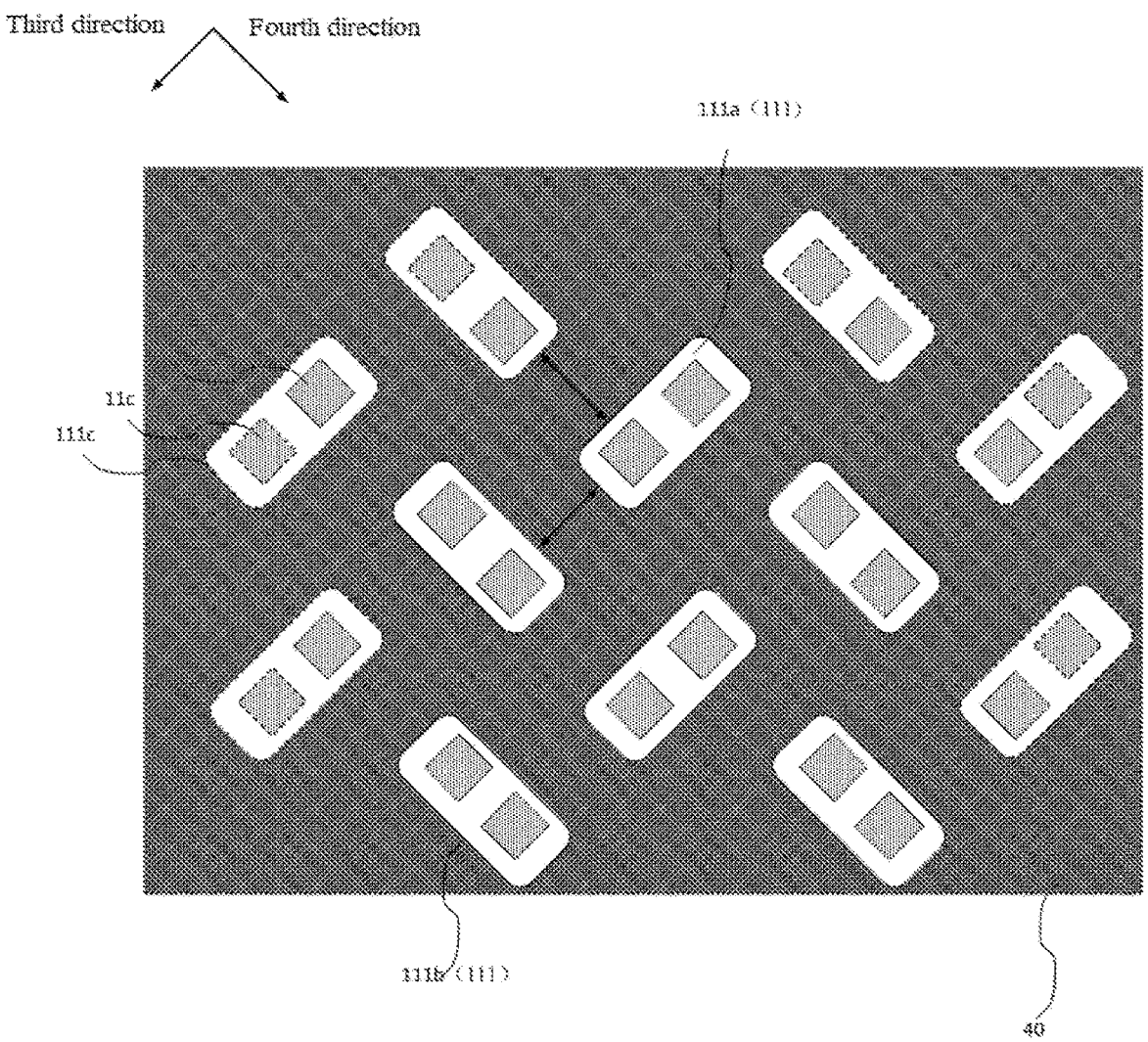
FIG. 4 is a schematic diagram of a mask for an organic light-emitting display panel according to an embodiment of the present disclosure.
Figure 5:
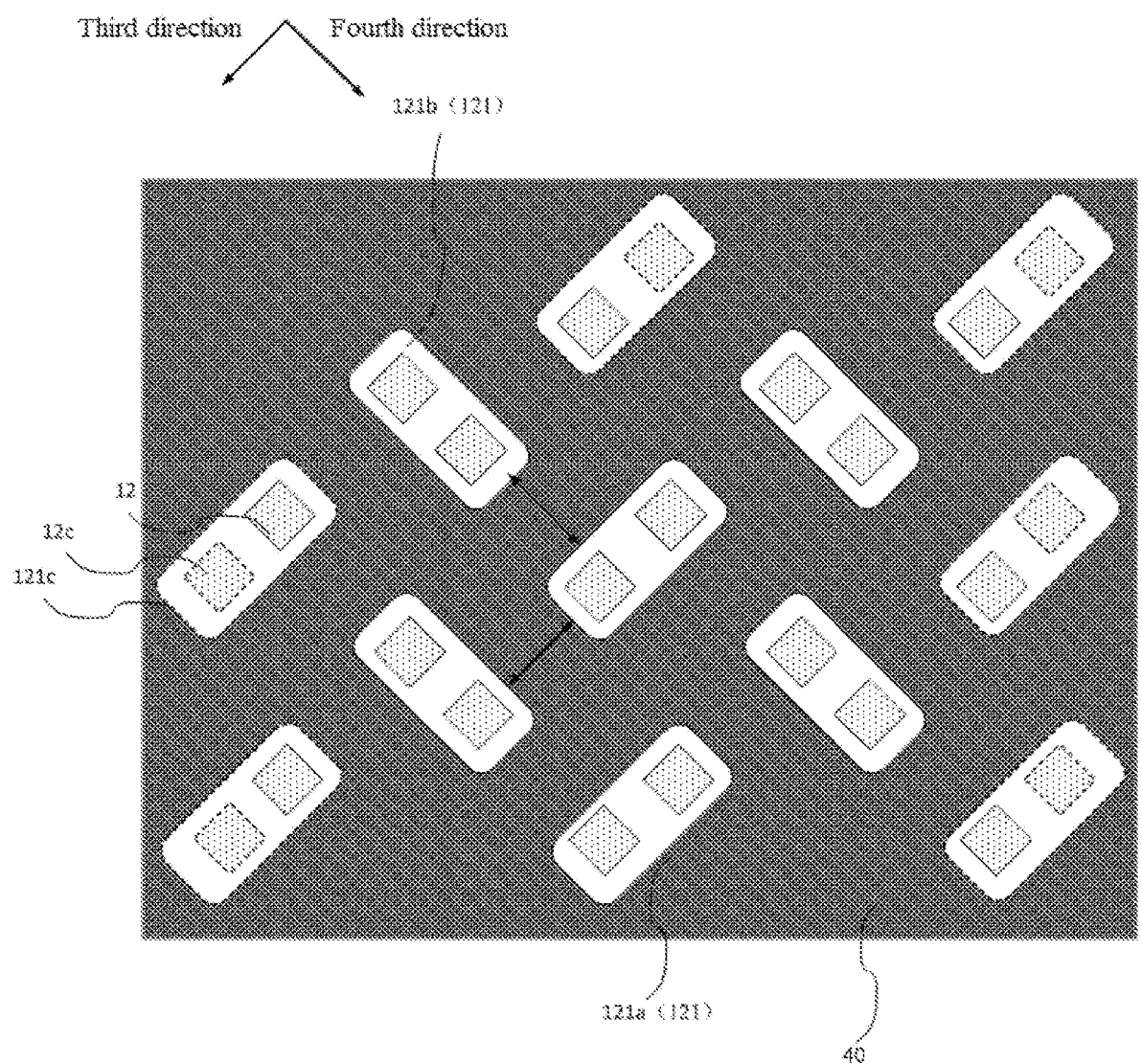
FIG. 5 is a schematic diagram of a mask for an organic light-emitting display panel according to another embodiment of the present disclosure.
Figure 6:
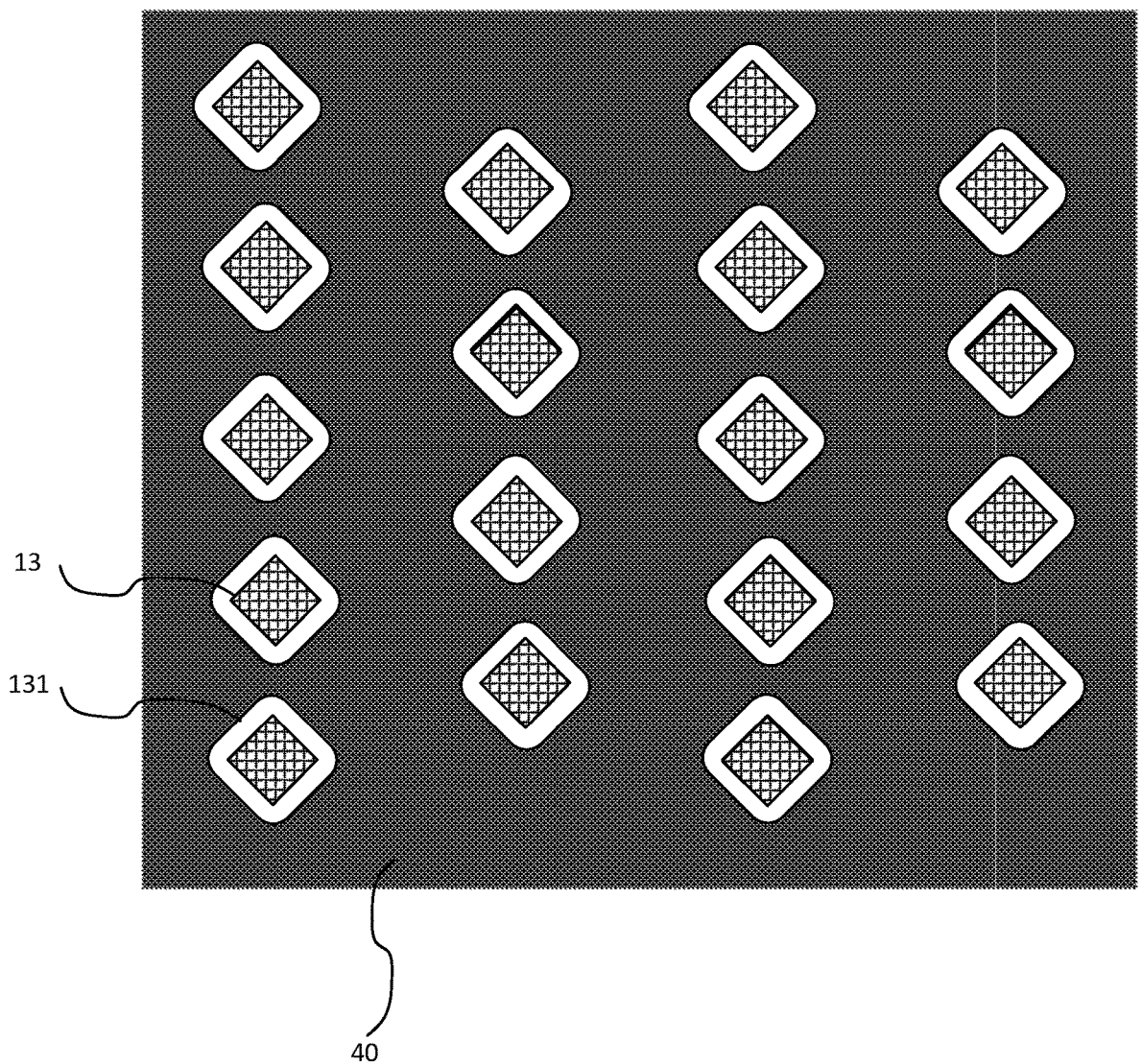
FIG. 6 is a schematic diagram of a mask for an organic light-emitting display panel according to yet another embodiment of the present disclosure.

Referring to FIG. 2, FIG. 4, FIG. 5, and FIG. 6, FIG. 2 is a schematic diagram of a pixel arrangement of an organic light-emitting display panel according to another embodiment of the present disclosure; FIG. 4 is a schematic diagram of a mask for a light-emitting display panel according to an embodiment of the present disclosure; FIG. 5 is a schematic diagram of a mask for an organic light-emitting display panel according to another embodiment of the present disclosure; and FIG. 6 is a schematic diagram of a mask of an organic light-emitting display panel according to yet another embodiment of the present disclosure.

As described above, the size of the opening of the fine mask, the distance between the openings, as well as the net-tension difficulty are important factors that limits the increase in pixel density. Due to the limitations in the manufacturing process of the fine mask, the opening and the distance between the openings both have minimum values. In the related art, one mask opening corresponds to one sub-pixel, and in this regard, the size of the sub-pixel and the distance between the sub-pixels cannot be made small enough, such that the enhancing of PPI has been limited. The present disclosure provides a pixel arrangement overcoming such limitations.

Two immediately adjacent first sub-pixels 11 are disposed in the same first light-emitting material region 110; and two immediately adjacent second sub-pixels 12 are disposed in the same second light-emitting material region 120. It should be noted that the first light-emitting material region 110 of the present disclosure is a region where the light-emitting material corresponding to the first sub-pixel is vapor-deposited. The light-emitting material corresponding to the first sub-pixel is vapor-deposited through the opening 111 as shown in FIG. 4, and the light-emitting material corresponding to the second sub-pixel is vapor-deposited through the opening 121 as shown in FIG. 5. In this way, one opening of the fine mask corresponds to two sub-pixels, which overcomes the limitation on the PPI caused by the size of the opening of the fine mask. Technically, the PPI can be doubled.

Further, the first light-emitting material regions 110 include type-A light-emitting material regions 110a each having a long axis extending along a third direction, and type-B light-emitting material regions 110b each having a long axis extending along a fourth direction; and distances between one type-A light-emitting material region 110a and four adjacent type-B light-emitting material regions 110b are equal to each other. The second light-emitting material regions 120 include type-A light-emitting material regions 120a each having a long axis extending along the third direction and type-B light-emitting material region 120b each having a long axis extending along the fourth direction; and distances between one type-A light-emitting material regions 120a and four adjacent type-B light-emitting material regions 120b are equal to each other. With the above arrangement of the first light-emitting material regions 110 and the second light-emitting material regions 120, the corresponding fine mask can be provided as a fine mask as shown in FIGS. 4 and 5. As shown in FIG. 4, when one opening of the fine mask corresponds to two first sub-pixels 11, then the opening is rectangular. Taking FIG. 4 as an example, a type-A opening 111a of a first opening corresponding to the type-A light-emitting material region 110a of the first light-emitting material region 110 has a rectangular shape, in which the long side extends in the third direction and the short side extends in the fourth direction. The fine mask is made of an isotropic material. Therefore, during the net-tension process, especially during the process of net-tension with the clips distributing around the mask, the stress along the third direction and the stress along the fourth direction are different, such that the mask can be torn by a shear stress generated therein. In the present disclosure, due to the presence of both the type-A light-emitting material regions 110a having a long axis extending in the third direction and the type-B light-emitting material regions 110b having a long axis extending in the fourth direction, a long side direction and a short side direction of a type-B opening 111b of the first opening corresponding to the type-B light-emitting material region 110b are opposite to those of the type-A opening 111a. The resulted stress difference between the third direction and the fourth direction caused from the type-B opening 111b is exactly opposite to and compensates the stress difference caused by the type-A opening 111a, so that no shear stress is generated and the mask is protected from being torn.

Further, in this embodiment, any type-A light-emitting material region 110a is equally spaced from four adjacent type-B light-emitting material regions 110b, and accordingly, any type-A opening 111a is equally spaced from four adjacent type-B openings 111b, so that the distribution of the body of the entire mask is more uniform. The stress tolerance of the entire mask is determined by the portion having the lowest stress tolerance. The uniform body of the mask provided in the present embodiment avoids a reduced stress tolerance of the whole mask due to a certain weak portion thereof.

Similarly, referring to FIG. 5, a type-A opening 121a of a second opening corresponding to the second light-emitting material region 120a is relatively long in the third direction and relatively short in the fourth direction. The fine mask is usually made of an isotropic material. Therefore, during the process of net-tension, especially during the process of net-tension with clips around the mask, a difference between the stress along the third direction and the stress along the fourth direction result in that the mask is torn by a shear stress generated by the mask. In the present disclosure, by simultaneously providing the type-A light-emitting material regions 120a having a long axis in the third direction and type-B light-emitting material regions 120b having a long axis in the fourth direction, a long side direction and a short side direction of a type-B opening 121b of the second opening corresponding to the type-B light-emitting material region 120b are opposite to those of the type-A opening 121a. The difference between the stress in the third direction and the stress in the fourth direction, which is caused by the type-B opening 121b, compensates for the difference of stress caused by the type-A opening 121a, thereby avoiding the generation of the shear stress and preventing the mask from being torn. Further, any type-A light-emitting material region 120a is equally spaced from four adjacent type-B light-emitting material regions 120b, and accordingly, any type-A opening 121a is equally spaced from four adjacent type-B openings 121b, so that the distribution of the body of the entire mask is more uniform. Since the stress tolerance of the entire mask is determined by the portion having the lowest stress tolerance, the uniform body of the mask provided in the present embodiment avoids a reduced stress tolerance of the whole mask due to a weak certain portion thereof.

It should be noted that the long axis in the present embodiment refers to the longer one of central axes of the light-emitting material region and is parallel to the long side of the light-emitting material region.

Further, the type-A light-emitting material region 110a and the type-B light-emitting material region 110b are alternately disposed along the third direction or the fourth direction. The type-A light-emitting material region 120a and the type-B light-emitting material region 120b are alternately disposed along the third direction or the fourth direction. The third direction is perpendicular to the fourth direction.

According to the present embodiment, along the type-A opening region 111a and the type-B opening region 111b, the fine mask along is subjected to stress oriented along the third direction or the fourth direction. Therefore, the type-A opening 111a and the type-B opening 111b that are alternatively arranged in the third direction and the fourth direction can avoid generating a shear stress in the third direction and the fourth direction, thereby preventing the fine mask from being destroyed in the net-tension process.

Figure 3:
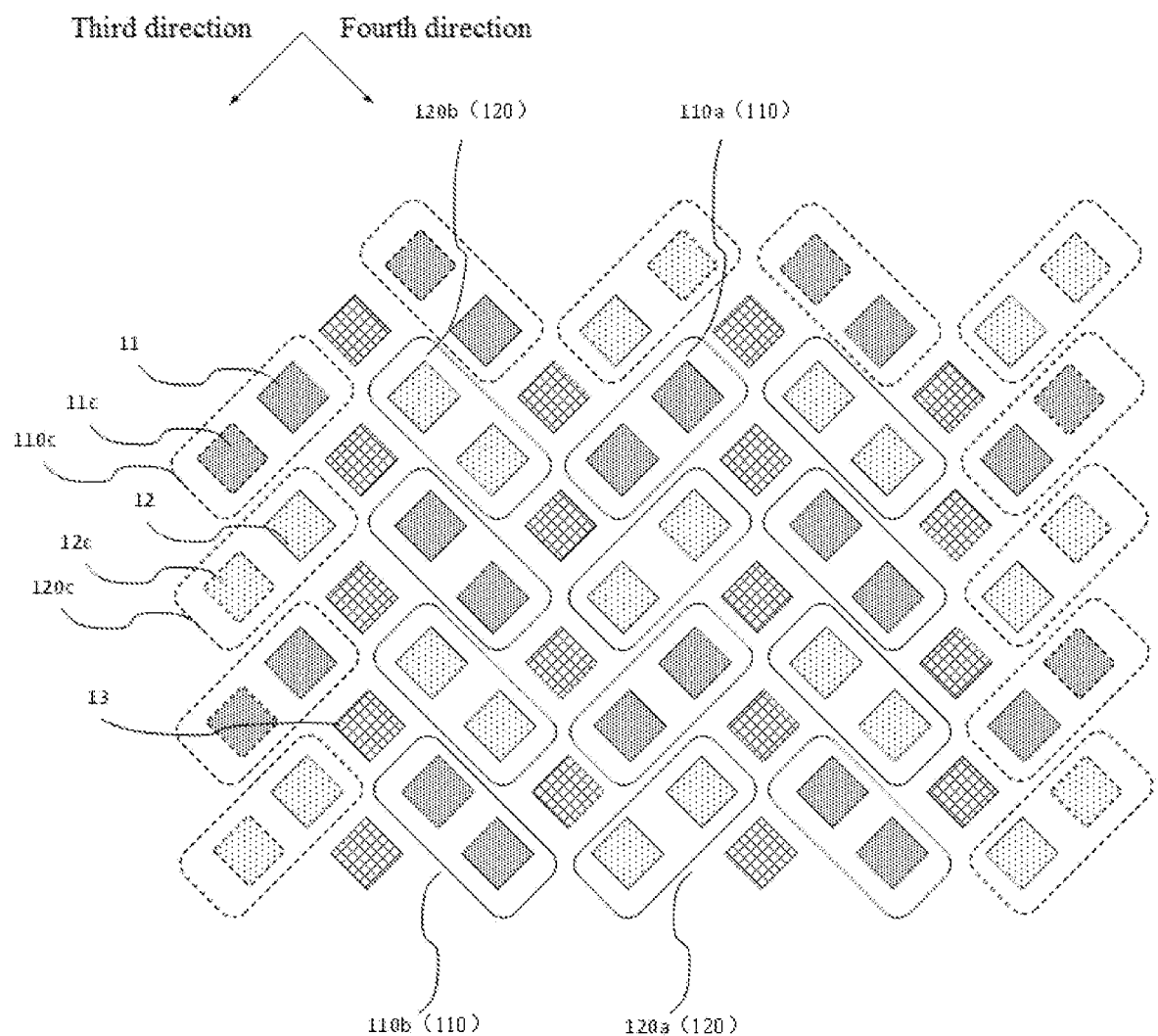
FIG. 3 is a schematic diagram of a pixel arrangement of an organic light-emitting display panel according to yet another embodiment of the present disclosure.

FIG. 3 is a schematic diagram of a pixel arrangement of an organic light-emitting display panel according to another embodiment of the present disclosure.

The first sub-pixel 11 and the second sub-pixel 12 of the pixel column or row located at the outermost edge do not have an adjacent first sub-pixel 11 and second sub-pixel 12 to constitute a first light-emitting material region 110 and a second light-emitting material region 120a. For example, in the embodiment as shown in FIG. 3, the first sub-pixel 11 and the second sub-pixel 12 in the first row, the first column, and the last column do not have an adjacent first sub-pixel 11 and second sub-pixel 12 to constitute a first light-emitting material region 110 and a second light-emitting material region 120. In this regard, the openings of the mask for vapor deposition corresponding to the first sub-pixel and the second sub-pixel at the outermost edge are smaller than the openings corresponding to the first light-emitting material region and the second light-emitting material region in the central region. On the one hand, the limit size value of the opening of the mask is determined by the minimum opening, and thus such mask still cannot be used to vapor-deposit a display panel of high PPI; and on the other hand, inconsistent sizes of the openings of the mask lead to inconsistent stress in the net-tension process of the mask, which can easily cause a stress concentration to destroy the mask. In view of the above, in this embodiment, a first dummy sub-pixel 11c, a second dummy sub-pixel 12c, a first dummy light-emitting material region 111c, and a second dummy light-emitting material region 121c are disposed on at least one edge of the pixel arrangement. The first dummy sub-pixel 11c is adjacent to a first sub-pixel 11 located at the edge in the third direction or the fourth direction, and the first dummy light-emitting material region 111c covers the first sub-pixel 11 and the first dummy sub-pixel 11c adjacent to the first sub-pixel 11. The second dummy sub-pixel 12c is adjacent to a second sub-pixel 12 located at the edge in the third direction or the fourth direction, and the second dummy light-emitting material region 121c covers the second sub-pixel 12 and the second dummy sub-pixel 12c adjacent to the second sub-pixel 12. With such arrangement manner of the present embodiment, on the one hand, the minimum opening of the mask is enlarged and the vapor-deposition of a high-PPI display panel is feasible; and on the other hand, with respect to the mask, the sizes of the openings for vapor-depositing the corresponding light-emitting material regions are uniform, thereby avoiding the stress concentration and protecting the mask.

The pixel arrangements known in the related art are typically used for a rendered design or a non-rendered design and cannot be simultaneously applied to two different pixel arrangements. The inventor has designed a novel pixel arrangement that is suitable for both rendered and non-rendered pixel arrangements.

Figure 8:
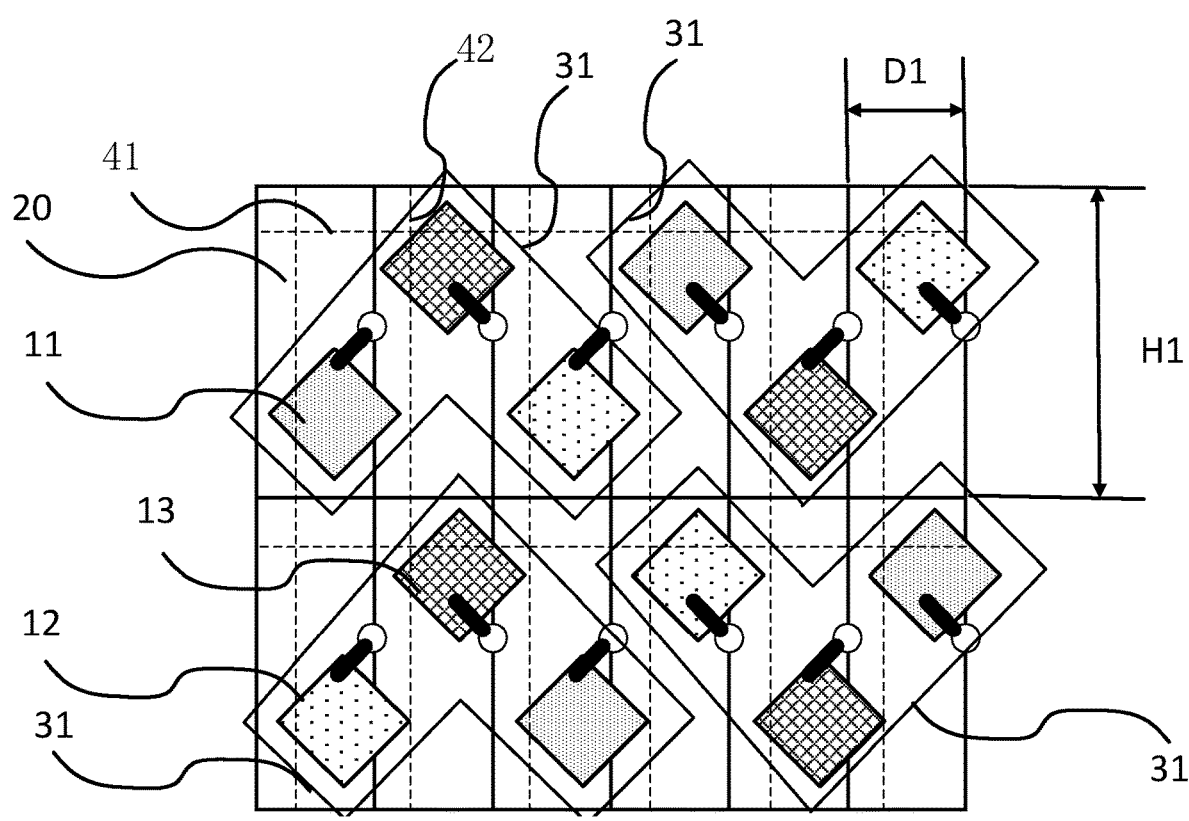
FIG. 8 is a schematic diagram of a pixel arrangement of an organic light-emitting display panel according to yet another embodiment of the present disclosure.
Figure 9:
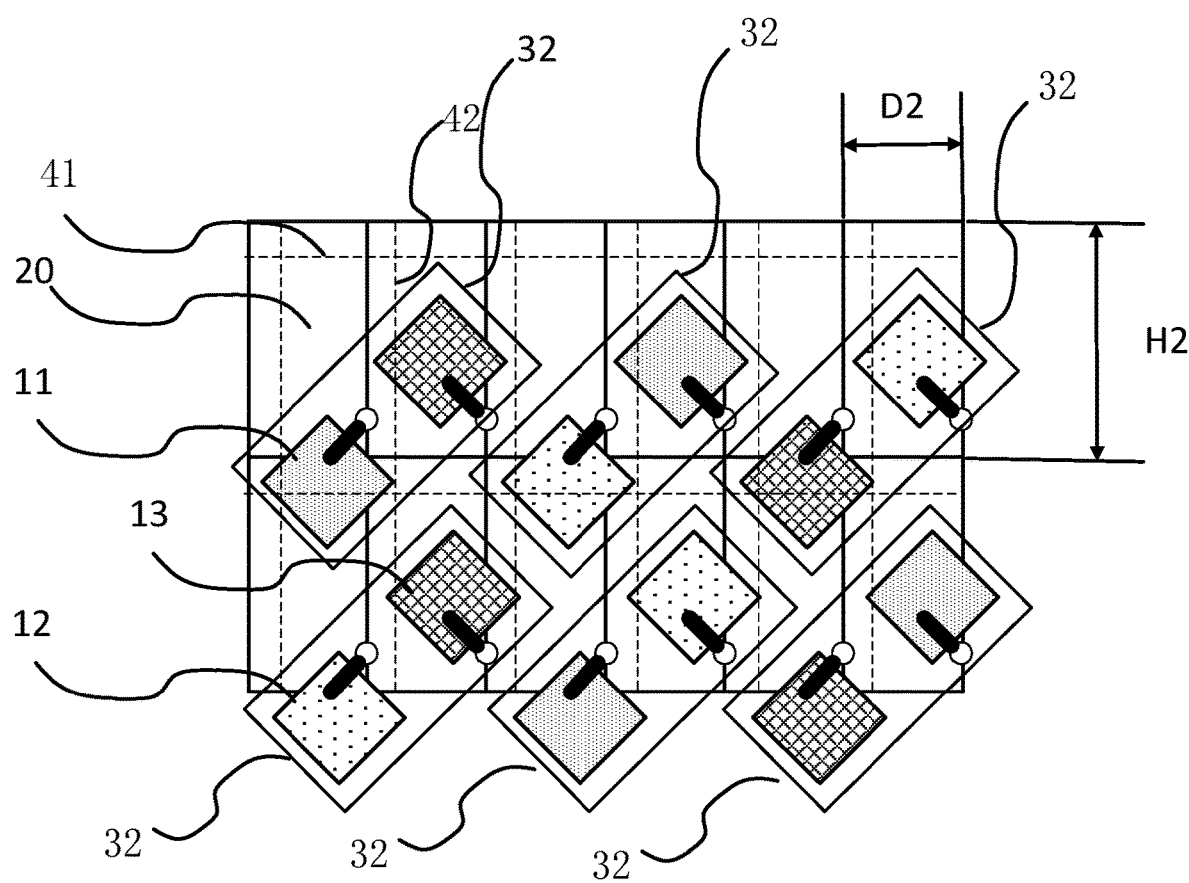
FIG. 9 is a schematic diagram of a pixel arrangement of an organic light-emitting display panel according to yet another embodiment of the present disclosure.
Figure 10:
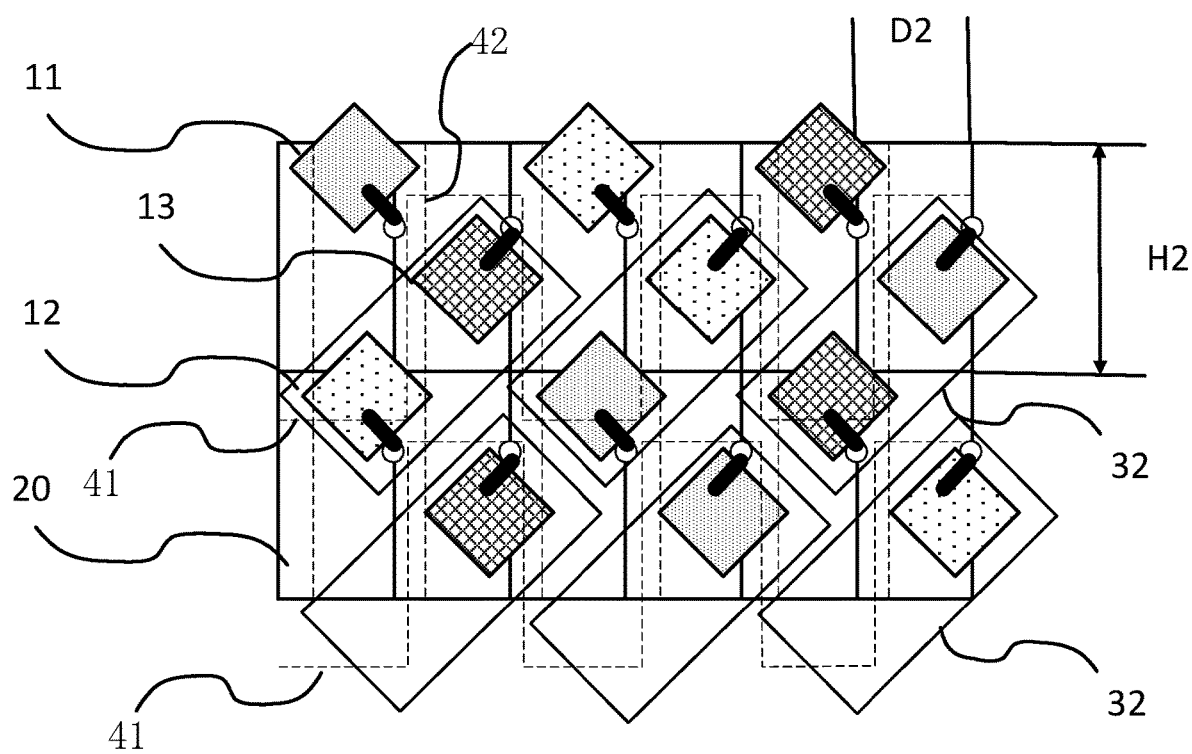
FIG. 10 is a schematic diagram of a pixel arrangement of an organic light-emitting display panel according to yet another embodiment of the present disclosure.

FIG. 8 is a schematic diagram of a pixel arrangement of an organic light-emitting display panel according to yet another embodiment of the present disclosure; FIG. 9 is a schematic diagram of a pixel arrangement of an organic light-emitting display panel according to yet another embodiment of the present disclosure; and FIG. 10 is a schematic diagram of a pixel arrangement of an organic light-emitting display panel according to yet another embodiment of the present disclosure.

In the organic light-emitting display panel, a display area, which corresponds to pixel units constituting the image, is required to be a square, in order to ensure that the displayed image is not stretched in a horizontal or vertical direction. Correspondingly, the driver circuit unit is also required to be a square, in order to ensure that the pixel unit is square. Specifically, when the rendered pixel arrangement is employed, each pixel unit includes two sub-pixels, each driving circuit unit includes two driving circuits, and the two driving circuits form a square repeating unit. When the non-rendered pixel arrangement is employed, each pixel unit includes three sub-pixels, each driving circuit unit includes three driving circuits, and the three driving circuits form a square repeating unit. In the related art, it is difficult to use the same pixel arrangement to design connection between pixels and the driving circuits of the rendered and non-rendered pixel arrangements.

The present embodiment includes a rendered pixel arrangement and a non-rendered pixel arrangement. For the non-rendered pixel arrangement, as shown in FIG. 8, a third sub-pixel 13 in the $i^{th}$ pixel row together with a first sub-pixel 11 and a second sub-pixel 12 in the $j^{th}$ pixel row constitute one first display unit 31; and a third sub-pixel 13 in the $j^{th}$ pixel row together with a first sub-pixel 11 and a second sub-pixel 12 in the $i^{th}$ pixel row constitute one first display unit 31.

A third sub-pixel 13 in the $(i+2)^{th}$ pixel row together with a first sub-pixel 11 and a second sub-pixel 12 in the $(j+2)^{th}$ pixel row constitute one first display unit 31; and a third sub-pixel 13 in the $(j+2)^{th}$ pixel row together with a first sub-pixel 11 and a second sub-pixel 12 in the $(i+2)^{th}$ pixel row constitute one first display unit 31.

Further, the display panel includes pixel driving circuits 20 corresponding to the sub-pixels, and the display panel further includes first pixel driving circuit units, where the sub-pixels refer to the first sub-pixel 11, the second sub-pixel 12, and the third sub-pixel 13.

Each of the first pixel driving circuit units includes pixel driving circuits 20 arranged in an array of one row and three columns. Each pixel driving circuit 20 has a width D1 along the second direction, and a length H1 along the second along the first direction is H1, where H1=3*D1.

Further referring to FIG. 8, for the pixel arrangement of FIG. 8, in one repeating unit, the sub-pixels of the first pixel column are connected to the driving circuit of the first column, the sub-pixels of the second pixel column are connected to the driving circuit of the second column, the sub-pixels of the third pixel column are connected to the driving circuit of the third column, the sub-pixels of the fourth pixel column are connected to the driving circuit of the fourth column, the sub-pixels of the fifth pixel column are connected to the driving circuit of the fifth column, and the sub-pixels of the sixth pixel column are connected to the driving circuit of the sixth column. In the repeating unit, the sub-pixels of the first pixel row and the second pixel row are connected to the driving circuits of the first row; the sub-pixels of the third pixel row and the fourth pixel row are connected to the driving circuits of the second row. According to the connection manner of the sub-pixels and the driving circuits of this embodiment, a distance between a connection point of the sub-pixel and a connection point of the driving circuit can be shortened, and the distances between the connection points of the sub-pixels and the connection points of the driving circuits are equal, so that loss of data transmission is reduced, the loss of data transmission for each sub-pixel is identical, and the display uniformity of the display panel is improved.

The display panel further includes scan lines 41 and data lines 42. The pixel driving circuits 20 in the same row are connected to the same scan line 41, and the pixel driving circuits in the same column are connected to the same data line 42. The sub-pixels belonging to the same display unit 31 are connected to the same scan line 41, and a data line 42 to which the third sub-pixel 13 is connected is connected only to the third sub-pixels 13. In this embodiment, by connecting the sub-pixels of the same first display unit 31 to the same scan line, the amount of algorithm operation can be reduced, thereby avoiding an asynchronous feeling caused by a time-division display of display information of the same pixel unit. On the other hand, the third sub-pixels can be green sub-pixels. Since the green sub-pixel has a different data voltage range from the red and blue sub-pixels, providing the green sub-pixels with a separate data line can avoid crosstalk and improve the image quality of the display panel.

For a non-rendered pixel arrangement, as shown in FIG. 9 and FIG. 10, a first sub-pixel 11 in the $i^{th}$ pixel row and a third sub-pixel 13 in the $j^{th}$ pixel row constitute one second display unit 32; a second sub-pixel 12 in the $i^{th}$ pixel row and a first sub-pixel 11 in the $j^{th}$ pixel row constitute a second display unit 32; and a third sub-pixel 13 of the $i^{th}$ pixel row and a second sub-pixel 12 in the $j^{th}$ pixel row constitute a second display unit 32.

A second sub-pixel 12 of the $(i+2)^{th}$ pixel row and a third sub-pixel 13 of the $(j+2)^{th}$ pixel row constitute a second display unit 32; a first sub-pixel 11 in the $(i+2)^{th}$ pixel row and a second sub-pixel 12 of the $(j+2)^{th}$ pixel row constitute a second display unit 32; and a third sub-pixel 13 in the $(i+2)^{th}$ pixel row and a first sub-pixel 11 in the $(j+2)^{th}$ pixel row constitute a second display unit 32; where i=2 and j=1.

Specifically, referring to FIG. 9, the first sub-pixel 11 in the $2^{nd}$ pixel row and the third sub-pixel 13 in the $1^{st}$ pixel row constitute one second display unit 32; the second sub-pixel 12 in the $2^{nd}$ pixel row and the first sub-pixel 11 in the $1^{st}$ pixel row constitute one second display unit 32; and the third sub-pixel 13 in the $2^{nd}$ pixel row and the second sub-pixel 12 in the $1^{st}$ pixel row constitute one second display unit 32.

The second sub-pixel 12 in the $4^{th}$ pixel row and the third sub-pixel 13 in the $3^{rd}$ pixel row constitute one second display unit 32; the first sub-pixel 11 in the $4^{th}$ pixel row and the second sub-pixel 12 in the $3^{rd}$ pixel row constitute one second display unit 32; and the third sub-pixel 13 in the $4^{th}$ pixel row and the first sub-pixel 11 in the $3^{rd}$ pixel row constitute one second display unit.

Further, the display panel includes pixel driving circuits corresponding to the sub-pixels, the display panel further includes second pixel driving circuit unit. The second pixel driving circuit unit includes pixel driving circuits 20 arranged in an array of one row and two columns. The pixel driving circuit has a width D2 along the second direction, and a length H2 along the first direction is H2, where H2=2*D2.

Referring to FIG. 9, for the pixel arrangement of FIG. 9, in one repeating unit, the sub-pixels of the first pixel column are connected to the driving circuits of the first column, the sub-pixels of the second pixel column are connected to the driving circuits of the second column, the sub-pixels of the third pixel column are connected to the driving circuits of the third column, the sub-pixels of the fourth pixel column are connected to the driving circuits of the fourth column, the sub-pixels of the fifth pixel column are connected to the driving circuits of the fifth column, and the sub-pixels of the sixth pixel column are connected to the drive circuits of the sixth column. In the repeating unit, the sub-pixels of the first pixel row and the second pixel row are connected to the driving circuits of the first row; and the sub-pixels of the third pixel row and the fourth pixel row are connected to the driving circuits of the second row. According to the connection manner of the pixels and the driving circuits of this embodiment, the resolution can be increased by 50%. Moreover, a distance between a connection point of the sub-pixel and a connection point of the driving circuit can be shortened, and the distances between the connection points of the sub-pixels and the connection points of the driving circuits are identical, so that loss of data transmission is reduced, the loss of data transmission for each sub-pixel is the same, and the display uniformity of the display panel is improved.

Further, in the embodiment of FIG. 9, the display panel includes scan lines 41 and data lines 42. The pixel driving circuits 20 in the same row are connected to the same scan line 41, and the pixel driving circuits in the same column are connected to the same data line 42; the sub-pixels belonging to the same first display unit 31 are connected to the same scan line 41, and the data line 42 to which the third sub-pixel 13 is connected is connected only to the third sub-pixels 13. In this embodiment, by connecting the sub-pixels of the same first display unit 31 to the same scan line, the amount of algorithm operation can be reduced, thereby avoiding the asynchronous feeling caused by a time-division display of display information of the same pixel unit. On the other hand, the third sub-pixels can be green sub-pixels. Since the green sub-pixel has a different data voltage range from the red and blue sub-pixels, providing the green sub-pixels with a separate data line can avoid crosstalk and improve the displayed image quality of the display panel.

The embodiment, in which i=1 and j=2, is shown in FIG. 10.

Specifically, a third sub-pixel 12 in the $2^{nd}$ pixel row and a second sub-pixel 12 in the $3^{rd}$ pixel row constitute one second display unit 32; a second sub-pixel 12 in the $2^{nd}$ pixel row and a first sub-pixel 11 in the $3^{rd}$ pixel row constitute one second display unit 32; and a first sub-pixel 11 in the $2^{nd}$ pixel row and a third sub-pixel 13 in the $3^{rd}$ pixel row constitute one second display unit 32.

A third sub-pixel 13 in the 4$^{th}$ pixel row and a first sub-pixel 11 in the 1$^{st}$ pixel row of a next repeating unit constitute one second display unit 32; a first sub-pixel 11 of the 4$^{th}$ pixel row and a second sub-pixel 12 in the 1$^{st}$ pixel row of the next repeating unit constitute one second display unit 32; and a second sub-pixel 12 in the 4$^{th}$ pixel row and a third sub-pixel 13 in the 1$^{st}$ pixel row of the next repeating unit constitute one second display unit.

In the present embodiment, the first pixel row of the repeating unit at the first row does not engage in displaying and thus serves as dummy sub-pixels. Similarly, the second, third, and fourth pixel rows in the repeating unit at the last row do not involve in display and serve as dummy sub-pixels.

Further referring to FIG. 10, for the pixel arrangement of FIG. 10, in one repeating unit, sub-pixels in the first pixel column are connected to driving circuits in the first column, sub-pixels in the second pixel column are connected to driving circuits in the second column, sub-pixels in the third pixel column are connected to driving circuits in the third column, sub-pixels in the fourth pixel column are connected to driving circuits in the fourth column, sub-pixels in the fifth pixel column are connected to driving circuits in the fifth column, and sub-pixels in the sixth pixel column are connected to driving circuits in the sixth column. In the repeating unit, the sub-pixels of the first pixel row and the second pixel row are connected to the driving circuits of the first row; and the sub-pixels of the third pixel row and the fourth pixel row are connected to the driving circuits of the second row. According to the connection manner of the pixels and the driving circuits of this embodiment, the resolution can be increased by 50%. Moreover, the distance between a connection point of the sub-pixel and a connection point of the driving circuit can be shortened, and the distances between the connection points of the sub-pixels and the connection points of the driving circuits are equal, so that loss of data transmission is reduced, the loss of data transmission for each sub-pixel is the same, and the display uniformity of the display panel is improved.

Further, according to the embodiment of FIG. 10, the display panel includes scan lines 41 and data lines 42. In this embodiment, sub-pixels belonging to the same second display unit 32 are connected to the same scan line 41, and the data line 42 to which the third sub-pixel 13 is connected is connected only to the third sub-pixels 13. In this embodiment, by connecting the sub-pixels of the same second display unit 32 to the same scan line, the amount of algorithm operation can be reduced, thereby avoiding the asynchronous feeling caused by a time-division display of display information of the same pixel unit. On the other hand, the third sub-pixels can be green sub-pixels. Since the green sub-pixel has a different data voltage range from the red and blue sub-pixels, providing the green sub-pixels with a separate data line can avoid crosstalk and improve the displayed image quality of the display panel.

Specifically, in the present disclosure, driving circuits of even-numbered columns of the m$^{th}$ row and driving circuits of odd-numbered columns of the (m+1)$^{th}$ row share the same scan line 41. In order to avoid a long wiring design in the actual panel, drive circuits located in the even-numbered columns and drive circuits located in odd-numbered columns can be mirror-symmetrically designed along the row direction, so that the wiring of the scan line becomes shorter.

Figure 11:
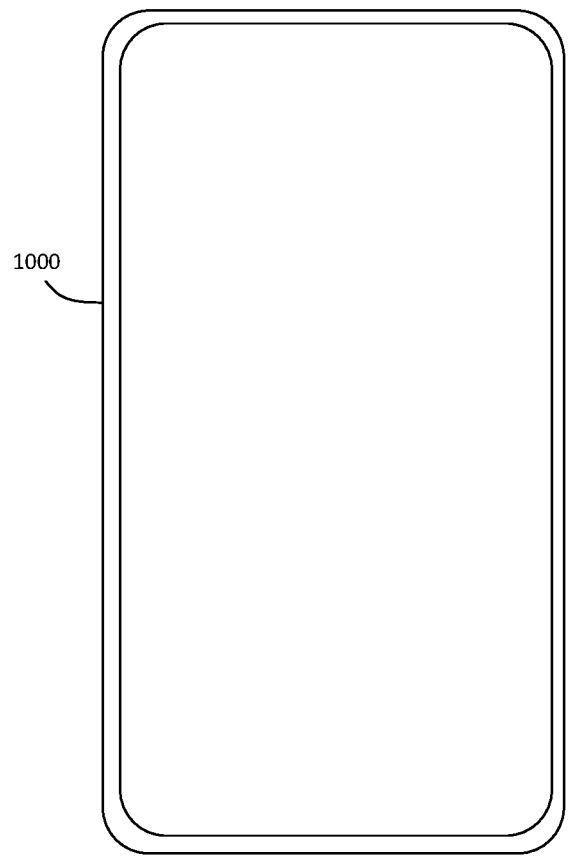
FIG. 11 is a schematic diagram of an organic light-emitting display panel according to an embodiment of the present disclosure.

The present disclosure also discloses an organic light-emitting display panel 1000 and a display device. The organic light-emitting display panel and display device according to the present disclosure may include the pixel arrangement of the organic light-emitting display panel as described above. The display device includes, but is not limited to, cellular mobile phone as shown in FIG. 11, tablet computer, display of computer, display for smart wearable devices, display device of vehicle, such as automobile. Any display device, including the pixel arrangement of the organic light-emitting display panel as disclosed in the present disclosure, shall fall within the protection scope of the present disclosure.

Those skilled in the art can clearly understand that, for convenience and conciseness of description, specific operating processes of the system, device and unit described above can refer to the corresponding processes in the foregoing embodiments, which are not described in detail herein.

The above-described embodiments are merely illustrative but not intended to provide any limitation to the present disclosure. Any modification, equivalent substitution, improvement, etc., made in accordance with the spirit and principles of the present disclosure shall be included within the protection scope of the present disclosure.

What is claimed is:

1. A pixel arrangement of an organic light-emitting display panel, comprising:
   repeating units arranged in an array,
   wherein each of the repeating units comprises a first pixel column, a second pixel column, a third pixel column, a fourth pixel column, a fifth pixel column, and a sixth pixel column that extend along a first direction and are arranged in a sequence along a second direction,
   wherein in each of the repeating units,
      the first pixel column comprises a first sub-pixel located in an i$^{th}$ pixel row and a second sub-pixel located in a (i+2)$^{th}$ pixel row,
      the second pixel column comprises a third sub-pixel located in a j$^{th}$ pixel row and a third sub-pixel located in a (j+2)$^{th}$ pixel row,
      the third pixel column comprises a second sub-pixel located in the i$^{th}$ pixel row and a first sub-pixel located in the (i+2)$^{th}$ pixel row,
      the fourth pixel column comprises a first sub-pixel located in the j$^{th}$ pixel row and a second sub-pixel located in the (j+2)$^{th}$ pixel row,
      the fifth pixel column comprises a third sub-pixel located in the i$^{th}$ pixel row and a third sub-pixel located in the (i+2)$^{th}$ pixel row, and
      the sixth pixel column includes a second sub-pixel located in the j$^{th}$ pixel row and a first sub-pixel located in the (j+2)$^{th}$ pixel row,
      where i=1 and j=2; or j=1 and i=2;
   two immediately adjacent first sub-pixels are disposed in a same first light-emitting material region, and two immediately adjacent second sub-pixels are disposed in a same second light-emitting material region;
   wherein the first light-emitting material region comprises type-A light-emitting material regions each having a long axis extending along a third direction and type-B light-emitting material regions each having a long axis extending along a fourth direction, any one of the type-A light-emitting material regions of the first light-emitting material region being equally spaced from four adjacent type-B light-emitting material regions of the first light-emitting material region,
   the second light-emitting material region comprises type-A light-emitting material regions each having a long axis extending along a third direction and type-B light-emitting material regions each having a long axis extending along a fourth direction, any one of the type-A light-emitting material regions of the second light-emitting material region is equally spaced from four adjacent type-B light-emitting material regions of the second light-emitting material region.

2. The pixel arrangement of an organic light-emitting display panel according to claim 1, wherein each third sub-pixel is a green sub-pixel, each first sub-pixel is a red sub-pixel, and each second sub-pixel is a blue sub-pixel, respectively.

3. The pixel arrangement of an organic light-emitting display panel according to claim 2, wherein the blue sub-pixel has a larger area than the red sub-pixel, and the area of the blue sub-pixel is larger than an area of the green sub-pixel.

4. The pixel arrangement of an organic light-emitting display panel according to claim 1, wherein any two adjacent third sub-pixels along the first direction are separated by a same distance, and any two adjacent third sub-pixels along the second direction are separated by a same distance.

5. The pixel arrangement of an organic light-emitting display panel according to claim 1, wherein the type-A light-emitting material regions of the first light-emitting material region and the type-B light-emitting material regions of the first light-emitting material region are alternately arranged along the third direction or the fourth direction, the type-A light-emitting material regions of the second light-emitting material region and the type-B light-emitting material regions of the second light-emitting material region are alternately arranged along the third direction or the fourth direction, and the third direction is perpendicular to the fourth direction.

6. The pixel arrangement of an organic light-emitting display panel according to claim 1, wherein a first dummy sub-pixel, a second dummy sub-pixel, a first dummy light-emitting material region, and a second dummy light-emitting material region are provided at least one edge position of the pixel arrangement, the first dummy sub-pixel is adjacent to a first sub-pixel located at the at least one edge position in the third direction or the fourth direction, and the first dummy light-emitting material region covers the adjacent first sub-pixel and dummy first sub-pixel;

the second dummy sub-pixel is adjacent to a second sub-pixel located at the at least one edge position in the third direction or the fourth direction, and the second dummy light-emitting material region covers the adjacent second sub-pixel and second dummy sub-pixel.

7. The pixel arrangement of an organic light-emitting display panel according to claim 1, wherein the third sub-pixel located in the $i^{th}$ pixel row, and the first and second sub-pixels in the $j^{th}$ pixel row constitute one first display unit; the third sub-pixel in the $i^{th}$ pixel row and the first and second sub-pixels in the $i^{th}$ pixel row constitute one first display unit;

the third sub-pixel located in the $(i+2)^{th}$ pixel row and the first and second sub-pixels in the $(j+2)^{th}$ pixel row constitute one first display unit; and the third sub-pixel in the $(j+2)^{th}$ pixel row and the first and second sub-pixels in the $(i+2)^{th}$ pixel row constitute one first display unit.

8. The pixel arrangement of an organic light-emitting display panel according to claim 1, wherein the first sub-pixel located in the $i^{th}$ pixel row and the third sub-pixel in the $j^{th}$ pixel row constitute one second display unit; the second sub-pixel in the $i^{th}$ pixel row and the first sub-pixel in the $j^{th}$ pixel row constitute one second display unit; and the third sub-pixel in the $i^{th}$ pixel row and the second sub-pixel in the $j^{th}$ pixel row constitute one second display unit; and the second sub-pixel in the $(i+2)^{th}$ pixel row and the third sub-pixel in the $(j+2)^{th}$ pixel row constitute one second display unit; the first sub-pixel in the $(i+2)^{t}$ pixel row and the second sub-pixel in the $(j+2)^{th}$ pixel row constitute one second display unit;

the third sub-pixel of the $(i+2)^{th}$ pixel row and the first sub-pixel in the $(j+2)^{th}$ pixel row constitute one second display unit;

wherein i=2 and j=1.

9. The pixel arrangement of an organic light-emitting display panel according to claim 1, wherein each first sub-pixel, each second sub-pixel, and each third sub-pixel each have a rhomboid shape.

10. An organic light-emitting display panel, comprising a pixel arrangement according to claim 1.

11. The organic light-emitting display panel according to claim 10, wherein any two adjacent third sub-pixels along the first direction are separated by a same distance, and any two adjacent third sub-pixels along the second direction are separated by a same distance.

12. The organic light-emitting display panel according to claim 10, wherein the third sub-pixel in the $i^{th}$ pixel row, and the first and second sub-pixels in the $j^{th}$ pixel row constitute one first display unit; the third sub-pixel in the $j^{th}$ pixel row and the first and second sub-pixels in the $i^{th}$ pixel row constitute one first display unit;

the third sub-pixel in the $(i+2)^{th}$ pixel row and the first and second sub-pixels in the $(j+2)^{th}$ pixel row constitute one first display unit; and the third sub-pixel in the $(j+2)^{th}$ pixel row and the first and second sub-pixels in the $(i+2)^{th}$ pixel row constitute one first display unit.

13. The organic light-emitting display panel according to claim 10, wherein the first sub-pixel in the $i^{th}$ pixel row and the third sub-pixel in the $i^{th}$ pixel row constitute one second display unit; the second sub-pixel in the $i^{th}$ pixel row and the first sub-pixel in the $j^{th}$ pixel row constitute one second display unit; and the third sub-pixel in the $i^{th}$ pixel row and the second sub-pixel in the $j^{th}$ pixel row constitute one second display unit; and the second sub-pixel in the $(i+2)^{th}$ pixel row and the third sub-pixel in the $(j+2)^{th}$ pixel row constitute one second display unit; the first sub-pixel in the $(i+2)^{t}$ pixel row and the second sub-pixel in the $(j+2)^{th}$ pixel row constitute one second display unit;

the third sub-pixel of the $(i+2)^{th}$ pixel row and the first sub-pixel in the $(j+2)^{th}$ pixel row constitute one second display unit;

wherein i=2 and j=1.

14. A pixel arrangement of an organic light-emitting display panel, comprising:

repeating units arranged in an array, wherein each of the repeating units comprises a first pixel column, a second pixel column, a third pixel column, a fourth pixel column, a fifth pixel column, and a sixth pixel column that extend along a first direction and are arranged in a sequence along a second direction, wherein in each of the repeating units, the first pixel column comprises a first sub-pixel located in an $i^{th}$ pixel row and a second sub-pixel located in a $(i+2)^{th}$ pixel row, the second pixel column comprises a third sub-pixel located in a $j^{th}$ pixel row and a third sub-pixel located in a $(j+2)^{th}$ pixel row, the third pixel column comprises a second sub-pixel located in the $i^{th}$ pixel row and a first sub-pixel located in the $(i+2)^{th}$ pixel row, the fourth pixel column comprises a first sub-pixel located in the $j^h$ pixel row and a second sub-pixel located in the $(j+2)^{th}$ pixel row, the fifth pixel column comprises a third sub-pixel located in the $i^{th}$ pixel row and a third sub-pixel located in the $(i+2)^{th}$ pixel row, and the sixth pixel column includes a second sub-pixel located in the $j^h$ pixel row and a first sub-pixel located in the $(j+2)^{th}$ pixel row, where i=1 and j=2; or j=1 and i=2;

wherein the third sub-pixel located in the $i^{th}$ pixel row, and the first and second sub-pixels in the $j^{th}$ pixel row constitute one first display unit; the third sub-pixel in the $j^{th}$ pixel row and the first and second sub-pixels in the $i^{th}$ pixel row constitute one first display unit;

the third sub-pixel located in the $(i+2)^{th}$ pixel row and the first and second sub-pixels in the $(j+2)^{th}$ pixel row constitute one first display unit; and the third sub-pixel in the $(j+2)^{th}$ pixel row and the first and second sub-pixels in the $(i+2)^{th}$ pixel row constitute one first display unit;

wherein the display panel comprises first pixel driving circuit units, each of the first pixel driving circuit units comprising pixel driving circuits arranged in an array of one row and three columns and corresponding to sub-pixels, a width of each of the pixel driving circuits along the second direction is D1, and a length of each of the pixel driving circuits along the first direction is 3*D1.

15. The pixel arrangement of an organic light-emitting display panel according to claim 14, wherein two immediately adjacent first sub-pixels are disposed in a same first light-emitting material region, and two immediately adjacent second sub-pixels are disposed in a same second light-emitting material region.

16. The pixel arrangement of an organic light-emitting display panel according to claim 14, wherein the display panel further comprises scan lines and data lines, pixel driving circuits in a same row are connected to a same scan line, and pixel driving circuits in a same column are connected to a same data line, sub-pixels belonging to a same first display unit are connected to a same scan line, and a data line of the data lines to which the third sub-pixels are connected is connected only to third sub-pixels.

17. A pixel arrangement of an organic light-emitting display panel comprising:

repeating units arranged in an array, wherein each of the repeating units comprises a first pixel column, a second pixel column, a third pixel column, a fourth pixel column, a fifth pixel column, and a sixth pixel column that extend along a first direction and are arranged in a sequence along a second direction, wherein in each of the repeating units, the first pixel column comprises a first sub-pixel located in an $i^{th}$ pixel row and a second sub-pixel located in a $(i+2)^{th}$ pixel row, the second pixel column comprises a third sub-pixel located in a $j^{th}$ pixel row and a third sub-pixel located in a $(j+2)^{th}$ pixel row, the third pixel column comprises a second sub-pixel located in the $i^{th}$ pixel row and a first sub-pixel located in the $(i+2)^{th}$ pixel row, the fourth pixel column comprises a first sub-pixel located in the $j^{th}$ pixel row and a second sub-pixel located in the $(j+2)^{th}$ pixel row, the fifth pixel column comprises a third sub-pixel located in the $i^{th}$ pixel row and a third sub-pixel located in the $(i+2)^{th}$ pixel row, and the sixth pixel column includes a second sub-pixel located in the $j^{th}$ pixel row and a first sub-pixel located in the $(j+2)^{th}$ pixel row, where i=1 and j=2; or j=1 and i=2, wherein the first sub-pixel located in the $i^{th}$ pixel row and the third sub-pixel in the $j^{th}$ pixel row constitute one second display unit the second sub-pixel in the $i^{th}$ pixel row and the first sub-pixel in the $j^{th}$ pixel row constitute one second display unit;

and the third sub-pixel in the $i^{th}$ pixel row and the second sub-pixel in the $j^{th}$ pixel row constitute one second display unit; and the second sub-pixel in the $(i+2)^{th}$ pixel row and the third sub-pixel in the $(j+2)^{th}$ pixel row constitute one second display unit the first sub-pixel in the $(i+2)^{th}$ pixel row and the second sub-pixel in the $(j+2)^{th}$ pixel row constitute one second display unit the third sub-pixel of the $(i+2)^{th}$ pixel row and the first sub-pixel in the $(j+2)^{th}$ pixel row constitute one second display unit;

wherein i=2 and j=1;

wherein the display panel further comprises second pixel driving circuit units, each of the second pixel driving circuit units comprising pixel driving circuits arranged in an array of one row and two columns and corresponding to sub-pixels, a width of each of the pixel driving circuits along the second direction is D2, and a length of each of the pixel driving circuits along the first direction is 2*D2.

18. The pixel arrangement of an organic light-emitting display panel according to claim 17, wherein the display panel further comprises scan lines and data lines, pixel driving circuits in a same row are connected to a same scan line, and pixel driving circuits in a same column are connected to a same data line;

sub-pixels belonging to a same second display unit are connected to a same scan line, and a data line of the data lines to which the third sub-pixel is connected is connected only to third sub-pixels.

19. The pixel arrangement of an organic light-emitting display panel according to claim 17, wherein two immediately adjacent first sub-pixels are disposed in a same first light-emitting material region, and two immediately adjacent second sub-pixels are disposed in a same second light-emitting material region.

* * * * *